US012672283B2

(12) United States Patent
Lee et al.

(10) Patent No.: US 12,672,283 B2
(45) Date of Patent: Jun. 30, 2026

(54) THREE-DIMENSIONAL SEMICONDUCTOR DEVICE AND METHOD OF MANUFACTURING THE THREE-DIMENSIONAL SEMICONDUCTOR DEVICE

(71) Applicant: SK hynix Inc., Icheon-si (KR)

(72) Inventors: Seung Min Lee, Icheon-si (KR); Jung Ryul Ahn, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 741 days.

(21) Appl. No.: 18/085,366

(22) Filed: Dec. 20, 2022

(65) Prior Publication Data

US 2023/0301103 A1 Sep. 21, 2023

(30) Foreign Application Priority Data

Mar. 18, 2022 (KR) ........................ 10-2022-0034065

(51) Int. Cl.
*H10B 43/27* (2023.01)
*H10B 41/10* (2023.01)
*H10B 41/27* (2023.01)
*H10B 43/10* (2023.01)
*H10B 43/50* (2023.01)

(52) U.S. Cl.
CPC ............ *H10B 43/27* (2023.02); *H10B 41/10* (2023.02); *H10B 41/27* (2023.02); *H10B 43/10* (2023.02); *H10B 43/50* (2023.02)

(58) Field of Classification Search
None
See application file for complete search history.

(56) References Cited

U.S. PATENT DOCUMENTS

| | | | | |
|---|---|---|---|---|
| 9,716,101 B2 | | 7/2017 | Lu et al. | |
| 12,477,749 B2 | * | 11/2025 | Zhang ................... | H10B 43/50 |
| 2012/0070944 A1 | * | 3/2012 | Kim ...................... | H10B 43/27 |
| | | | | 257/E21.614 |
| 2021/0066345 A1 | * | 3/2021 | Son ....................... | H10B 43/35 |
| 2022/0406720 A1 | * | 12/2022 | Hinoue ............... | H01L 23/5226 |
| 2023/0301102 A1 | | 9/2023 | Ahn | |

FOREIGN PATENT DOCUMENTS

KR        20210127432 A  * 10/2021   ......... H01L 25/0657

* cited by examiner

*Primary Examiner* — William B Partridge
*Assistant Examiner* — Alexandre X Ramirez
(74) *Attorney, Agent, or Firm* — WILLIAM PARK AND ASSOCIATES LTD.

(57) ABSTRACT

A 3D semiconductor device may include a stack structure and a vertical channel structure. The stack structure may include a first insulation pattern, a lower conductive pattern and a second insulation pattern. The lower conductive pattern may be arranged on the first insulation pattern. The second insulation pattern may be arranged on the lower conductive pattern. The first insulation pattern may have a thickness thicker than a thickness of the second insulation pattern. The vertical channel structure may be arranged in the stack structure. The lower conductive pattern may have an upper surface directly in contact with a lower surface of the second insulation pattern.

19 Claims, 26 Drawing Sheets

<u>3000</u>

THREE-DIMENSIONAL SEMICONDUCTOR DEVICE AND METHOD OF MANUFACTURING THE THREE-DIMENSIONAL SEMICONDUCTOR DEVICE

CROSS-REFERENCES TO RELATED APPLICATION

The present application claims priority under 35 U.S.C. § 119(a) to Korean application number 10-2022-0034065, filed on Mar. 18, 2022, in the Korean intellectual Property Office, which is incorporated herein by reference in its entirety.

BACKGROUND

1. Technical Field

Various embodiments generally relate to a semiconductor device and a method of manufacturing the semiconductor device, more particularly, to a three-dimensional semiconductor device and a method of manufacturing the three-dimensional semiconductor device.

2. Related Art

An integration degree of a semiconductor device may be mainly determined by an occupying area of a unit memory cell. Recently, as integration degree improvements of the semiconductor device including a single memory cell on a substrate may have been come to limits, a three-dimensional (3D) semiconductor device including memory cells stacked on a substrate may be proposed. Further, in order to improve operational reliability of the 3D semiconductor device, various structures and fabrication methods may be developed.

SUMMARY

According to examples of embodiments, there may be provided a three-dimensional (3D) semiconductor device. The 3D semiconductor device may include at least one stack structure and at least one vertical channel structure. The stack structure may include a first insulation pattern, a lower conductive pattern and a second insulation pattern sequentially stacked. The first insulation pattern may include a first thickness, and the second insulation pattern includes a second thickness different from the first thickness. An upper surface of each of the lower conductive patterns may be directly in contact with a lower surface of each of the second insulation patterns According to examples of embodiments, there may be provided a three-dimensional (3D) semiconductor device. The 3D semiconductor device may include a stack structure and at least one vertical channel structure. The stack structure may include at least one unit memory block. The unit memory block may include a first insulation pattern, a lower word line, a second insulation pattern and an upper word line at least once sequentially stacked in a cell region and a contact area. The vertical channel structure may include a data storage layer formed through the stack structure in the cell region. The first insulation pattern in the cell region may have a thickness thicker than a thickness of the second insulation pattern in the cell region.

According to examples of embodiments, there may be provided a method of manufacturing a 3D semiconductor device. In the method of manufacturing the 3D semiconductor device, a first insulating interlayer and a sacrificial layer may be alternately stacked at least once to form a stack structure. The sacrificial layer may be selectively removed to form an opening between the first insulating interlayers. A conductive layer may be formed on an inner surface of the opening. A second insulating interlayer may be formed in the opening with the conductive layer. The second insulating interlayer may have a thickness different from a thickness of the first insulating interlayer. A hole may be formed through the stack structure. The conductive layer exposed through the hole may be removed to define a word line. A vertical channel structure may be formed in the hole.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected, Thus, the described embodiments should not be construed as being limited to the particular configurations and shapes illustrated herein but may include deviations in configurations and shapes which do not depart from the spirit and scope of the present disclosure as defined in the appended claims. It will be understood that when an element, pattern, surface, or layer etc., is referred to as being "on," "connected to" or "coupled to" another element, pattern, surface, or layer etc., it can be directly on, connected or coupled to the other element, pattern, surface, or layer etc., or intervening element, pattern, surface, or layer etc., may be present. In contrast, when an element, pattern, surface, or layer etc., is referred to as being "directly on," "directly connected to," "directly contacted with" or "directly coupled to" another element, pattern, surface, or layer etc., there are no intervening element, pattern, surface, or layer etc., present The present disclosure is described herein with reference to cross-section and/or plan illustrations of idealized embodiments of the present disclosure. However, embodiments should not be construed as limiting the concepts. Although a few embodiments will be shown and described, it will be appreciated by those of ordinary skill in the art that changes may be made in these embodiments without departing from the principles and spirit of the present disclosure.

Hereinafter, a 3D semiconductor device of various embodiments may be illustrated in detail with reference to accompanying drawings.

Figure 1A:
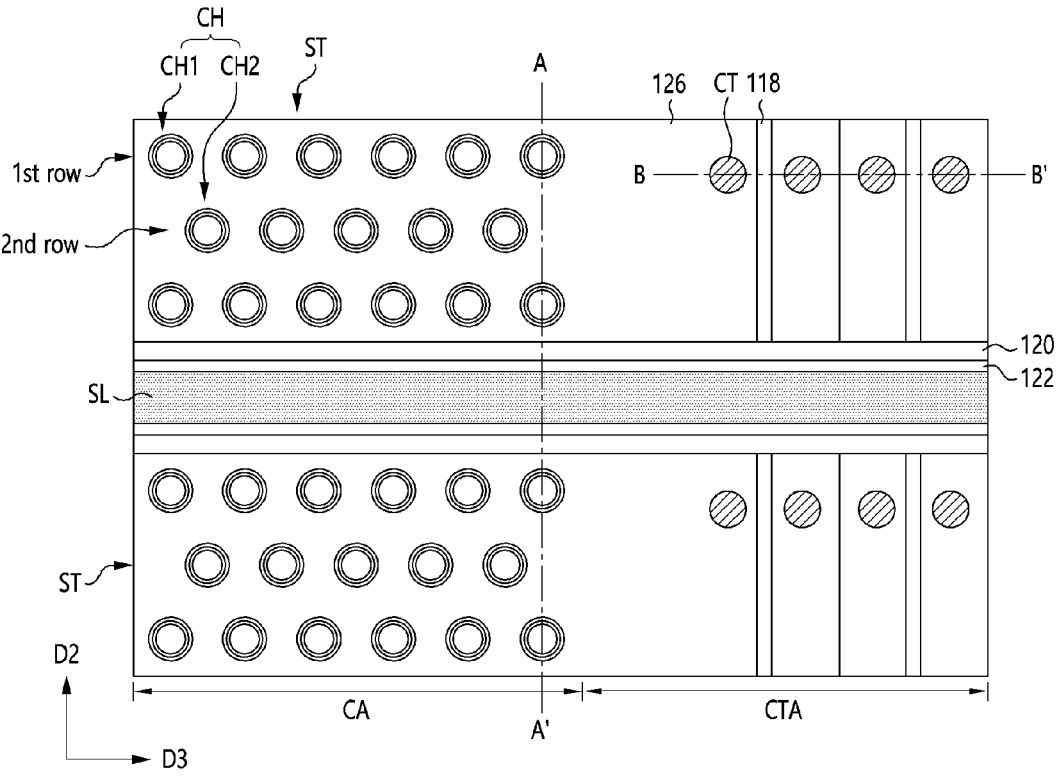
FIGS. 1A, 1B, and 1C are views illustrating a 3D semiconductor device in accordance with various embodiments.
Figure 1B:
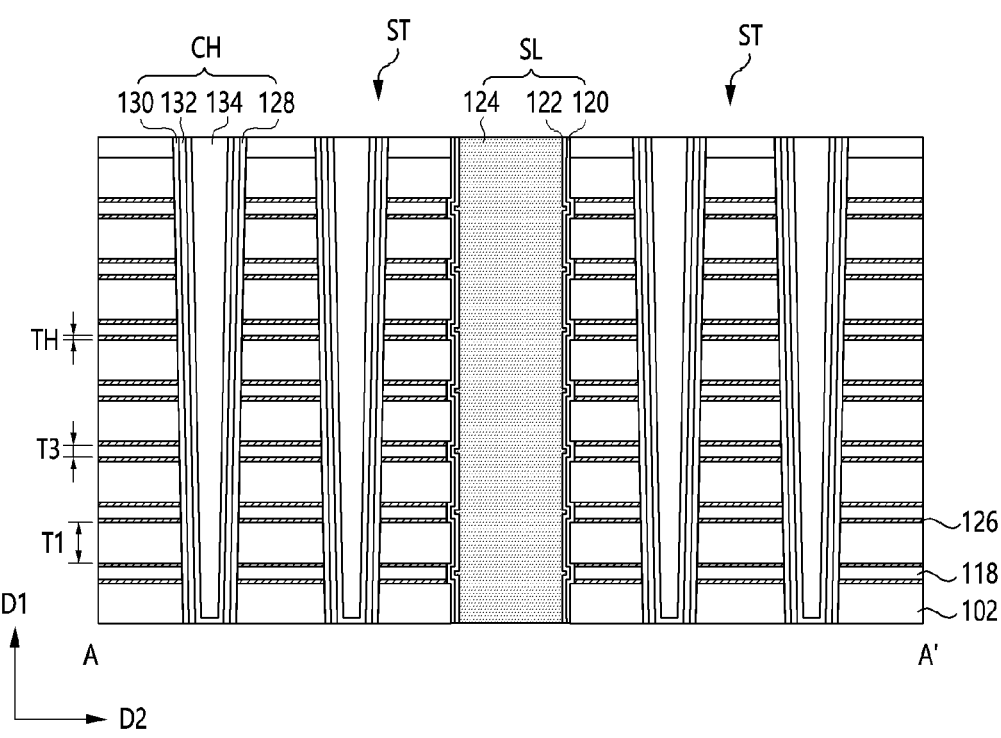
Figure 1C:
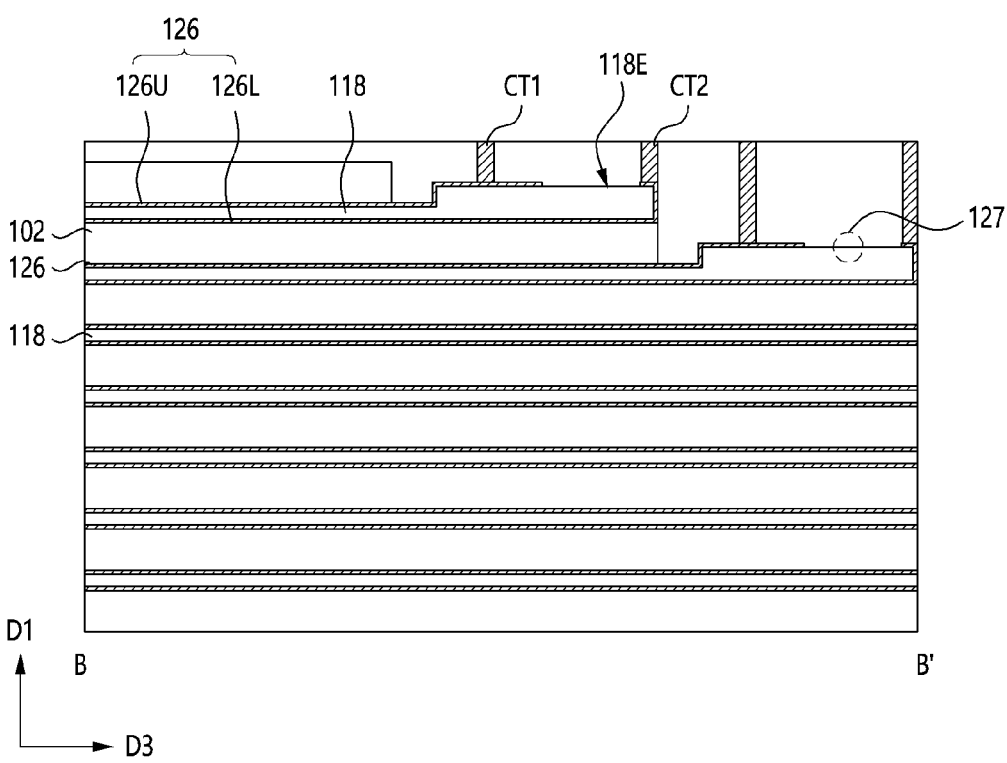

FIGS. 1A to 1C are views illustrating a 3D semiconductor device in accordance with various embodiments. FIG. 1A is a plan view illustrating the 3D semiconductor device. FIG. 1B is a cross-sectional view taken along a line A-A' in FIG. 1A. FIG. 1C is a cross-sectional view taken along a line B-B' in FIG. 1A.

Referring to FIGS. 1A to 1C, a 3D semiconductor device may include at least one stack structure ST, at least one vertical channel structure CH and at least one contact plug CT.

The stack structure ST may include a plurality of conductive patterns 126 and insulation patterns 102 and 118. The insulation patterns 102 and 118 may be arranged between the conductive patterns 126 to electrically isolate the conductive patterns 126 from each other. The insulation patterns 102 and 118 may have different thicknesses. The insulation patterns 102 and 118 may include first insulation patterns 102 and second insulation patterns 118. In various embodiments, the stack structure ST may include the first insulation patterns 102, the conductive pattern 126, the second insulation patterns 118, the conductive pattern 126 and the first insulation pattern 102 repeatedly stacked in a vertical direction. Hereinafter, the vertical direction may be referred to as a first direction D1.

In various embodiments, the first insulation pattern 102 may have a thickness T1 different from a thickness T3 of the second insulation pattern 118. For example, the thickness T1 of the first insulation pattern 102 may be thicker than the thickness T3 of the second insulation pattern 118. For example, the thickness T1 of the first insulation pattern 102 may be about 1.5 times to about 2.5 times the thickness T3 of the second insulation pattern 118. Further, the thickness T1 of the first insulation pattern 102 may be greater than a sum of thicknesses (THx2) of the adjacent two conductive patterns 126 and the thickness T3 of the second insulation pattern 118 between the adjacent two conductive patterns 126 (That is, T1>2TH+T3).

In various embodiments, the first insulation pattern 102 and the second insulation pattern 118 may include the same material or different materials. The first insulation pattern 102 and the second insulation pattern 118 may include an insulation material such as oxide, nitride, an air gap, etc. For example, the first insulation pattern 102 and the second insulation pattern 118 may include at least one of silicon oxide layer, a silicon nitride layer and silicon oxy-nitride layer. Alternatively, the first insulation pattern 102 and the second insulation pattern 118 may include the same insulating layer, but stoichiometric ratios of the first insulation pattern 102 and the second insulation pattern 118 may be different. For example, any one of the first and second insulation patterns 102 and 118 may include a silicon-rich nitride layer and the other may include a silicon nitride layer that satisfies the stoichiometric ratio of the silicon nitride material. Further, the first insulation pattern 102 and the second insulation pattern 118 may include impurities such as n type impurities, p type impurities, carbon, nitrogen, etc.

Further, the first insulation pattern 102 and the second insulation pattern 118 may have different thicknesses, a permittivity of the first insulation pattern 102 and a permittivity of the second insulation pattern 118 may be substantially same. Thus, a capacitance of a capacitor including the first insulation pattern 102 and the conductive patterns 126 contacted with the first insulation pattern 102 and a capacitance of a capacitor including the second insulation pattern 118 and the conductive patterns 126 contacted with the second insulation pattern 118 may be substantially uniform. For example, at least one of the first insulation pattern 102 and the second insulation pattern 118 may include any one of a perovskite ternary metal oxide layer such as $SrZO_3$, $LaALO_3$, $CaZrO_3$, $SrTiO_3$, etc., a binary metal layer such as $ZrO_3$, $HfO_2$, $La_2O_3$, $Ta_2O_5$, etc., and an amorphous metal oxide layer. At least one of the first and second insulation patterns 102 and 118 may include at least one of oxide including silicon oxide and oxide containing a metal, nitride including silicon nitride and silicon oxy-nitride, an insulation material including impurities and an air gap.

The stack structure ST may include a cell region CA and a contact area CTA. The first insulation patterns 102 and the second insulation patterns 118 may be formed in the cell region CA and the contact area CTA.

Each of the first insulation patterns 102, the conductive patterns 126 and the second insulation patterns 118 in the contact area CTA may have a stepped structure having a downwardly protruded shape to secure contact portions of the conductive patterns 126, This stepped structure of the contact area CTA may be formed by a slimming process. For example, each of the second insulation patterns 118 may include a line shape with both end portions 118E. At least one end portion 118E of each of the second insulation patterns 118 may be located at the contact area CTA. A thickness of the end portion 118E located at the contact area CTA may be greater than thickness T3 of the second insulation pattern 118 except the end portion 118E located at the contact area CTA.

As described above, each of the conductive patterns 126 may have the thickness TH thinner than the thickness T3 of the second insulation pattern 118. In an embodiment, the thickness TH of the conductive pattern 126 may be thinner than the thicknesses T1 and T3 of the first insulation pattern 102 and the second insulation pattern 118 to reduce a height of the 3D semiconductor device. Further, in an embodiment, a plurality of the conductive patterns 126 may be arranged in the 3D semiconductor device having a same height to improve an integration degree of the 3D semiconductor device. The conductive patterns 126 may include a metal material for example, titanium nitride (TiN), tungsten (W) or molybdenum (Mo). The conductive patterns 126 may include a doped polysilicon including conductive impurities, but are not limited thereto.

In various embodiments, the conductive pattern 126 may include a barrier layer and a conductive layer. The barrier layer may include a titanium nitride (TiN) layer, a titanium/titanium nitride (Ti/TiN) layer, etc. The barrier layer may be interposed between the first insulation pattern 102 and the conductive layer. For example, the conductive layer may include a tungsten material. Meanwhile, when the conductive pattern 126 may include a molybdenum material, the barrier layer might not be required between the first insulation pattern 102 and the conductive layer. In the embodiments, the conductive pattern 126 may correspond to a word line, a drain select line or a source line in a cell string of a NAND memory device.

As described above, the conductive patterns 126 may be arranged in the cell region CA and the contact area CIA. Each of the conductive patterns 126 in the cell region CA may be configured to surround the vertical channel structures CH, The conductive patterns 126 may extend in parallel with each other in a second direction D2.

For example, the conductive pattern 126 under the second insulation pattern 118 will be referred to as a lower conductive pattern 126L, and the conductive pattern 126 on the second insulation pattern 118 will be referred to as an upper conductive pattern 126U, referring to FIG. 1C.

Further, the lower conductive pattern 126L may be used as a lower word line and the upper conductive pattern 126U may be used as an upper word line.

The upper conductive pattern 126U in the contact area CTA may be extended to cover an upper surface of the second insulation pattern 118 except for an edge of the end portion 118E of the second insulation pattern 118. The lower conductive pattern 126L may be extended to cover a lower surface of the second insulation pattern 118, a side surface of the end portion 118E of the second insulation pattern 118 and the edge of the upper surface of the end portion 118E. At that time, the lower conductive pattern 126L may extend to the edge of the upper surface of the second insulation pattern 118, but may be electrically isolated from the upper conductive pattern 126U.

The lower conductive pattern 126L and the upper conductive pattern 126U may be separated by a cut portion 127 of the conductive pattern 126. The cut portion 127 may be arranged at the upper surface of the end portion 118E of the second insulation pattern 118.

The vertical channel structures CH may be formed through the stack structure ST along the first direction D1. The vertical channel structures CH may be formed in the cell region CA, Each of the vertical channel structures CH may have a cylindrical shape. The cylindrical vertical channel structure CH may have a diameter that decreases in the vertical direction or downward vertical direction, as for example shown in FIG. 1b. In an embodiment, this decrease in diameter for the cylindrical vertical channel structure CH may be due to a height of the stack structure ST.

In a planar view defined along the second direction D2 and the third direction D3 substantially perpendicular to the first direction D1, the vertical channel structures CH may include a plurality of first vertical channel structures CH1 and a plurality of second vertical channel structures CH2. For example, the first vertical channel structures CH1 may be arranged to space apart with a set distance forming first rows 1$^{st}$ row. The second vertical channel structures CH2 may be arranged to space apart with the set distance forming second rows 2$^{nd}$ row. The second vertical channel structure CH2 may be arranged between the first vertical channel structures and may be located between adjacent first rows, as shown in FIG. 1A.

The first vertical channel structures CH1 and the second vertical channel structures CH2 may be repeatedly arranged in the first rows and second rows, respectively, but are not limited thereto.

Each of the vertical channel structures CH may include a channel 134 and memory layers 128, 130 and 132 configured to surround the channel 134. The channel 134 may include a semiconductor material such as silicon, germanium, a nano-structure, etc. The memory layers 128, 130 and 132 may be interposed between the channel 134 and the conductive pattern 126, For example, the memory layers 128, 130 and 132 may include a tunnel insulation layer 132, a data storage layer 130 and a blocking insulation layer 128.

The tunnel insulation layer 132 may be configured to surround the channel 134. The data storage layer 130 may be configured to surround the tunnel insulation layer 132, The blocking insulation layer 128 may be configured to surround the data storage layer 130. The data storage layer 130 may store data changed using a Fowler-Nordheim tunneling. In various embodiments, the data storage layer 130 may include a charge-trapping nitride layer. The blocking insulation layer 128 may include oxide for blocking a charge. The tunnel insulation layer 132 may include silicon oxide capable of a charge tunneling.

The adjacent two stack structures ST may be spaced apart from each other by a slit structure SL, In various embodiments, the slit structure SL may include a source contact plug 124 and insulation spacers 120 and 122. The insulation spacers 120 and 122 may be configured to surround an outer surface of the source contact plug 124. Alternatively, the slit structure SL may include an insulation material. Further, the slit structure SL may include the insulation spacers 120 and 122 without the source contact plug 124.

The contact plugs CT may be electrically connected with the conductive patterns 126 in the contact area CTA, respectively. In various embodiments, the contact plugs CT may be positioned on the second insulation pattern 118 having the relatively thick thickness, that is, the end portion 118E of the second insulation pattern 118.

Figure 2A:
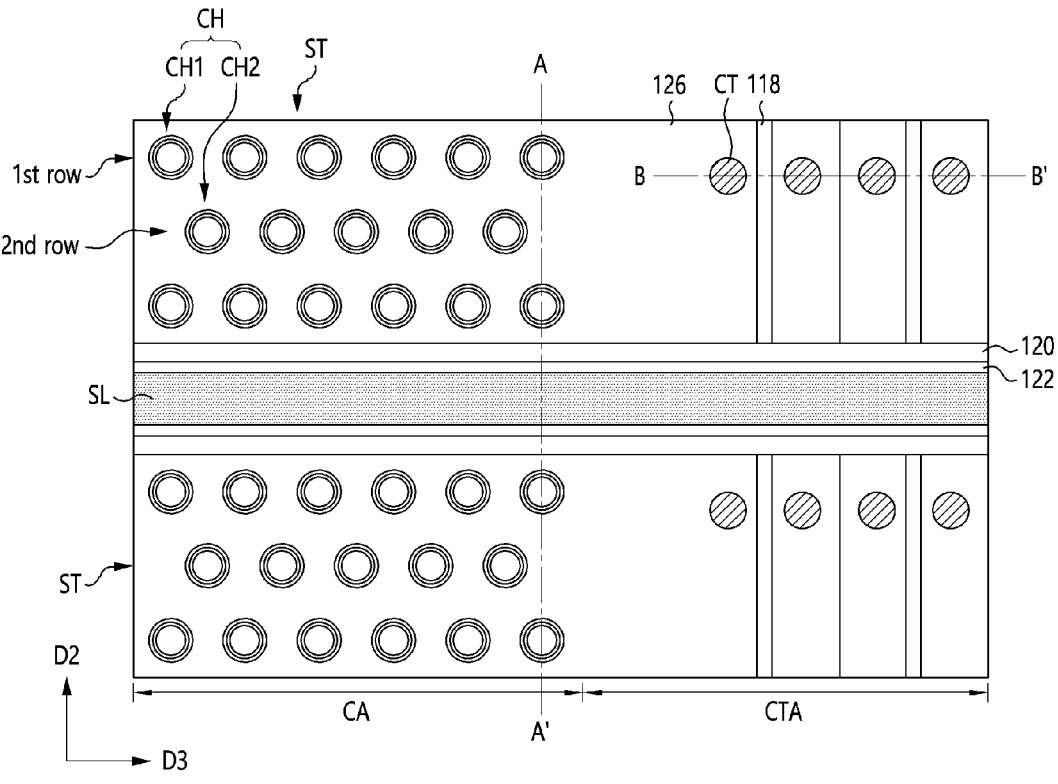
FIGS. 2A, 2B, and 2C are views illustrating a 3D semiconductor device in accordance with various embodiments.
Figure 2B:
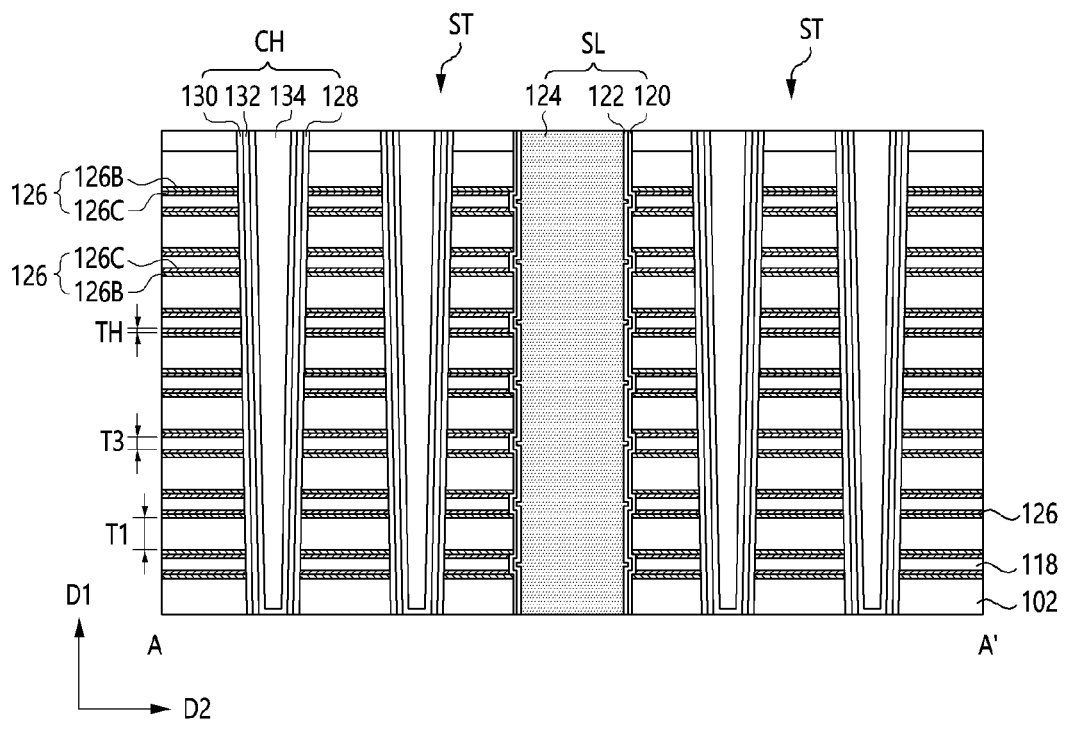
Figure 2C:
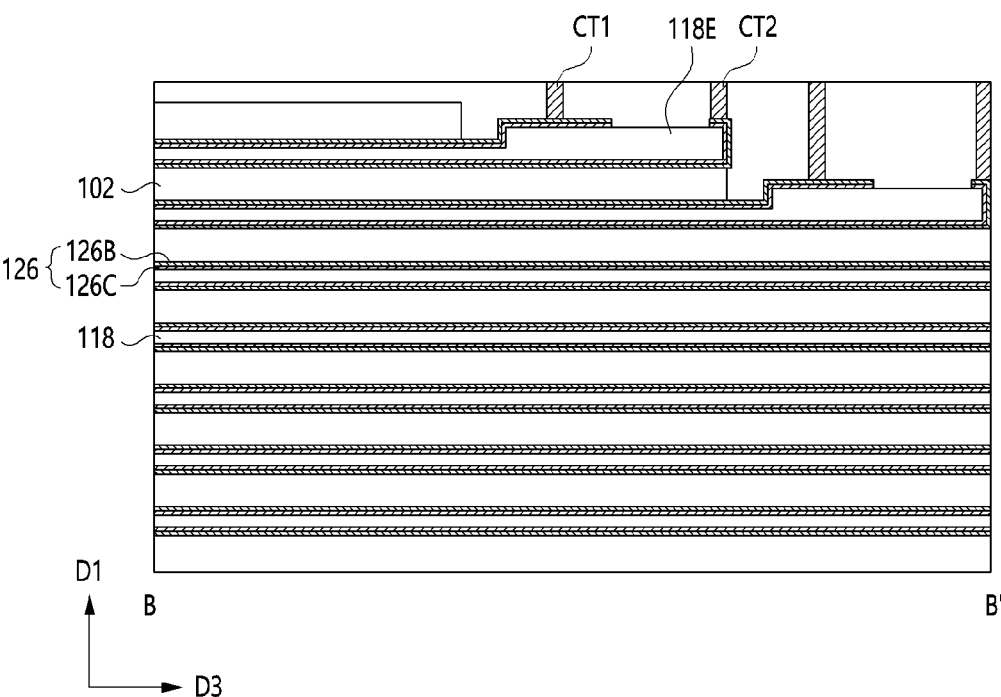

As mentioned above, because the cut portion 127 may be formed at the end portion 118E of the second insulation pattern 118, each of the lower conductive patterns 126L may extend to the edge of the upper surface of the second insulation pattern 118 in contact therewith. Thus, the contact plugs CT1 and CT2 which are respectively contacted with the upper conductive pattern 126U and the lower conductive pattern 126L in contact with one second insulation pattern 118 may have a same height, FIGS. 2A to 2C are views illustrating a 3D semiconductor device in accordance with various embodiments. FIG. 2A is a plan view illustrating the 3D semiconductor device, FIG. 2B is a cross-sectional view taken along a line A-A' in FIG. 2A and FIG. 2C is a cross-sectional view taken along a line B-B' in FIG. 2A.

Referring to FIGS. 2A to 2C, a 3D semiconductor device may include a stack structure ST, a vertical channel structure CH and contact plugs CT.

The stack structure ST may include a plurality of conductive patterns 126 and insulation patterns 102 and 118. The plurality of conductive patterns 126 may be vertically stacked. The insulation patterns 102 and 118 may be arranged between the conductive patterns 126 to electrically isolate the conductive patterns 126 from each other. The insulation patterns 102 and 118 may include first insulation patterns 102 and second insulation patterns 118, In various embodiments, the stack structure ST may include the first insulation pattern 102, the conductive pattern 126, the second insulation pattern 118, the conductive pattern 126 and the first insulation pattern 102 repeatedly stacked in the vertical direction. For example, each of the conductive pattern 126 may include a barrier layer 126B and a conductive layer 126C stacked on the barrier layer 126B. For example, the barrier layer 126B may make contact with the first insulation pattern 102. The conductive layer 126C may make contact with the second insulation pattern 118. The barrier layer 1268 may include a TiN layer. The conductive layer 126C may include a tungsten material.

The 3D semiconductor device in FIGS. 2A to 2C may be substantially the same as the 3D semiconductor device in FIGS. 1A to 1C except for the conductive pattern 126, Thus, any further illustrations with respect to the 3D semiconductor device in FIGS. 2A to 2C may be omitted herein for brevity.

Figure 3:
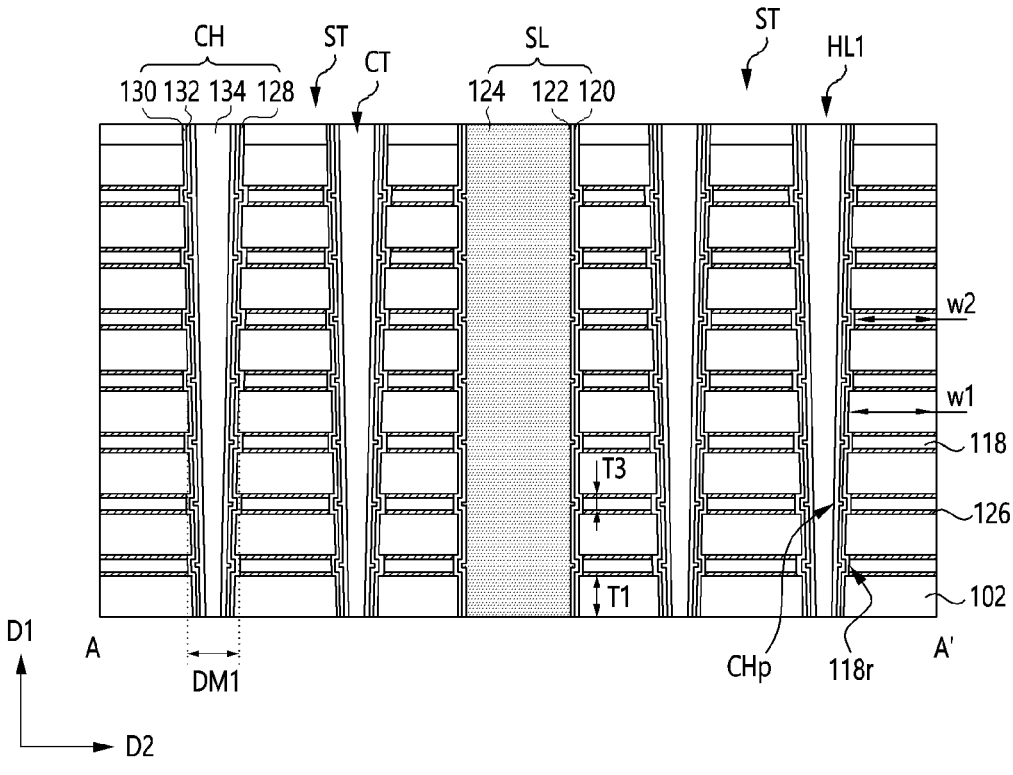
FIG. 3 is a view illustrating a 3D semiconductor device in accordance with various embodiments.

FIG. 3 is a view illustrating a 3D semiconductor device in accordance with various embodiments.

A plan view of the 3D semiconductor device in FIG. 3 may be substantially the same as the 3D semiconductor device in FIG. 1A. Thus, FIG. 3 is a cross-sectional view taken along a line A-A' in FIG. 1A. A contact area of the 3D semiconductor device in FIG. 3 may be substantially the same as the contact area in FIG. 1C. Therefore, drawings with respect to the same structure may be omitted herein for brevity.

Referring to FIG. 3, a 3D semiconductor device may include a stack structure ST, a vertical channel structure CH and contact plugs CT.

The stack structure ST may include a plurality of conductive patterns 126 and insulation patterns 102 and 118. The plurality of conductive patterns 126 may be vertically stacked. The insulation patterns 102 and 118 may be arranged between the conductive patterns 126 to electrically isolate the conductive patterns 126 from each other. For example, the thickness T1 of the first insulation pattern 102 may be thicker than the thickness T3 of the second insulation pattern 118. For example, the thickness T1 of the first insulation pattern 102 may be about 1.5 times to about 2.5 times the thickness T3 of the second insulation pattern 118.

In various embodiments, the first insulation pattern 102 may have a width W1 wider than a width W2 of the second insulation patterns 118 adjacent to the first insulation pattern 102. In other words, the width W2 of each of the second insulation patterns 118 may be narrower than the width W1 of the first insulation pattern 102. Sidewalls of the first insulation patterns 102 which correspond to an outer surface of the vertical channel structure CH may be protrude between the adjacent two second insulation patterns 118. The widths W1 and W2 may correspond to a length along the second direction D2 in drawings.

Each of the conductive patterns 126 may have a width substantially the same as the width W2 of the second insulation pattern 118, Thus, a concave recessed portion 118r may be defined in sidewalls of the second insulation patterns 118 which correspond to the outer surface of the vertical channel structure CH.

In FIG. 3, the conductive pattern 126 may include a single layer without a barrier layer. Alternatively, as shown in FIG. 26, the conductive pattern 126 may include a barrier layer and a conductive layer stacked on the barrier layer.

Each of the vertical channel structures CH may include a channel 134 and memory layers 128, 130 and 132 configured to surround the channel 134. The memory layers 128, 130 and 132 may be interposed between the channel 134 and the conductive pattern 126. The memory layers 128, 130 and 132 may include a tunnel insulation layer 132 configured to surround the channel 134, a data storage layer 130 configured to surround the tunnel insulation layer 132 and a blocking insulation layer 128 configured to surround the data storage layer 130.

In a vertical cross-sectional view, each of the vertical channel structures CH may have protruded portions CHp corresponding to the recessed portions 118r. For example, the memory layers 128, 130 and 132 may partially protrude. The protruded portions CHp may be provided to the outer surface of the vertical channel structure CH corresponding to the second insulation pattern 118. In an embodiment, the protruded portion CHp may protrude towards a corresponding insulation pattern 118 located at a level of the protruded portion CHp as shown in FIG. 3.

The 3D semiconductor device in FIG. 3 may be substantially the same as the 3D semiconductor device in FIGS. 1A to 1C except for the recess portions 118r of the second insulation pattern 118 and the protruded portions CHp of each of the vertical channel structure CH. Thus, any further illustrations with respect to the 3D semiconductor device in FIG. 3 may be omitted herein for brevity.

Hereinafter, a method of manufacturing a 3D semiconductor device in accordance with various embodiments may be illustrated with reference to drawings, FIGS. 4A, 4B, 5, 6A, 6B, 7A, 7B, 8A, 8B, 9, 10, 11, 12A and 12B are cross-sectional views illustrating a method of manufacturing a 3D semiconductor device in accordance with various embodiments. FIGS. 4A, 5, 6A, 7A, 8A, 9, 10, 11 and 12A may show a method of manufacturing the 3D semiconductor device in a cell region. FIGS. 4B, 6B, 7B, 8B and 12B may show a method of manufacturing the 3D semiconductor device in a contact area.

Figure 4A:
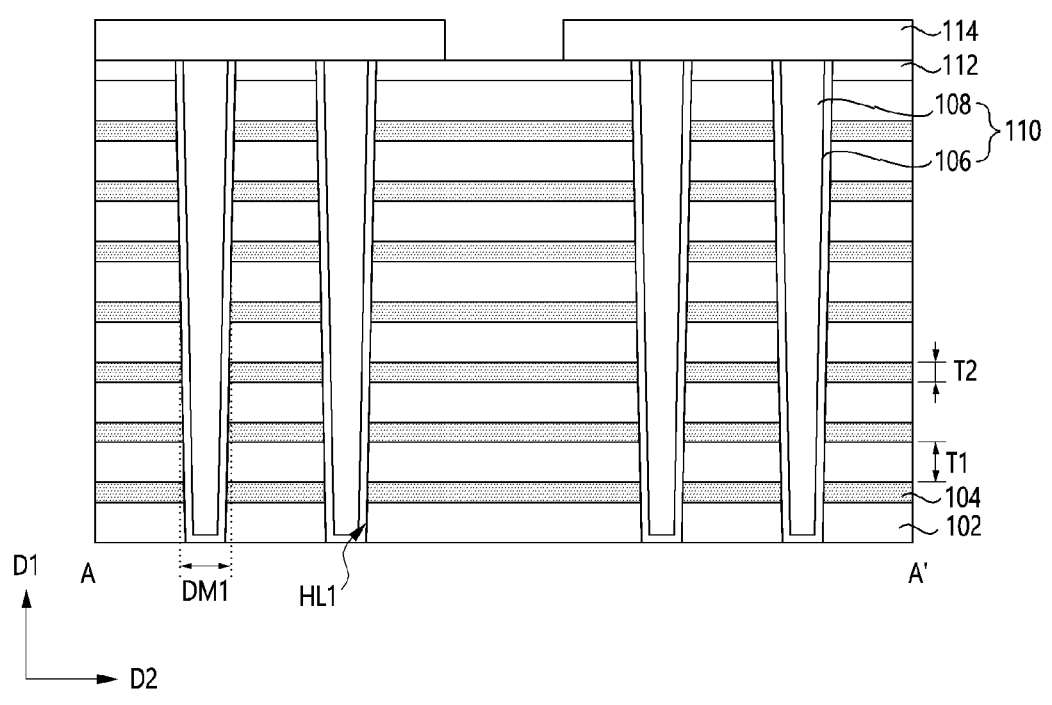
FIGS. 4A, 4B, 5, 6A, 6B, 7A, 7B, 8A, 8B, 9, 10, 11, 12A and 12B are cross-sectional views illustrating a method of manufacturing a 3D semiconductor device in accordance with various embodiments.
Figure 4B:
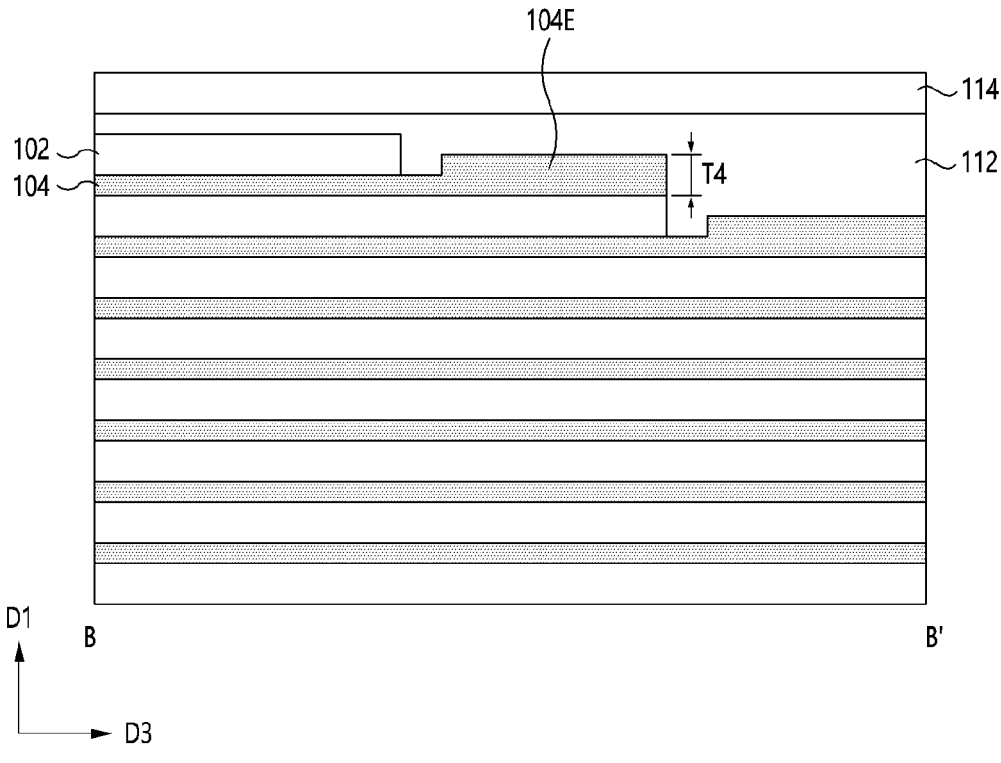

Referring to FIGS. 4A and 4B, a plurality of first insulation patterns 102 and a plurality of sacrificial patterns 104 alternately stacked to form a stack structure ST. A plurality of sacrificial pillars 110 may be formed through the stack structure ST. The stack structure ST may be formed in the cell region CA and the contact area CTA.

For example, the first insulation patterns 102 may include a silicon oxide layer. The sacrificial patterns 104 may include a material having an etching selectivity with respect to an etchant for the first insulation pattern 102. For example, the sacrificial pattern 104 may include a silicon nitride layer.

The first insulation pattern 102 may have a first thickness T1. The sacrificial pattern 104 may have a second thickness T2. The first thickness T1 may be thicker than the second thickness T2, In various embodiments, the first thickness T1 may be about 1.5 times to about 3 times the second thickness T2 considering a thickness of a conductive pattern (not shown) to be formed later. For example, the thickness of the sacrificial pattern 104 in the cell region CA may be different from that of the sacrificial pattern 104 in the contact area CTA. In this embodiment, the thickness of the sacrificial pattern 104 in the contact area CTA may be referred to as a thickness of an end portion 104E, The thickness of the end portion 104E may be thicker than a thickness of the sacrificial pattern 104 in the cell region CA.

The end portion 104E of the sacrificial pattern 104 may be formed in the following manner. Firstly, a sacrificial layer may be formed on the first insulation pattern 102. For example, the sacrificial layer may be formed to have a fourth thickness 14 greater than the second thickness T2. The sacrificial layer may be etched to have the second thickness T2 except for a portion predetermined as the end portion 104E, thereby forming the sacrificial pattern 104.

The stack structure ST may be etched to form a plurality of first holes HL1 in the cell region CA. The first holes HL1 may be formed through the stack structure ST in a direction substantially perpendicular to a surface of a substrate (hereinafter, referred to as a first direction D1). In various embodiments, each of the first holes HL1 may have a first diameter DM1. The first hole HL1 may have decreased diameters as the depth of the first hole HL1 increases. The first diameter DM1 may be an average diameter of the decreased diameters. The contact area CTA may be masked during the first holes HL1 may be formed in the cell region CA.

The first holes HL1 may be filled with at least one sacrificial material to form the sacrificial pillars 110. The sacrificial pillars 110 may include a plurality of sacrificial materials. Each of the sacrificial pillars 110 may include a first layer 106 and a second layer 108. The first layer 106 may be conformally formed along surface of the stack structure ST including the first holes HL1. The second layer 108 may be formed to fill the first hole HL1 with the first layer 106. For example, the first layer 106 may include a silicon oxide layer. The second layer 108 may include a polysilicon layer.

A mask pattern 114 may be formed on the stack structure ST with the sacrificial pillars 110. The mask pattern 114 may be provided to define a trench. The mask pattern 114 may include a photoresist pattern.

As shown in drawings, an insulating interlayer 112 may be additionally formed between the stack structure ST and the mask pattern 114. The insulating interlayer 112 may include a material having an etching selectivity with respect to an etchant for the sacrificial pattern 104, For example, the insulating interlayer 112 may include a silicon oxide layer. Alternatively, the formation of the insulating interlayer 112 may be omitted.

Figure 5:
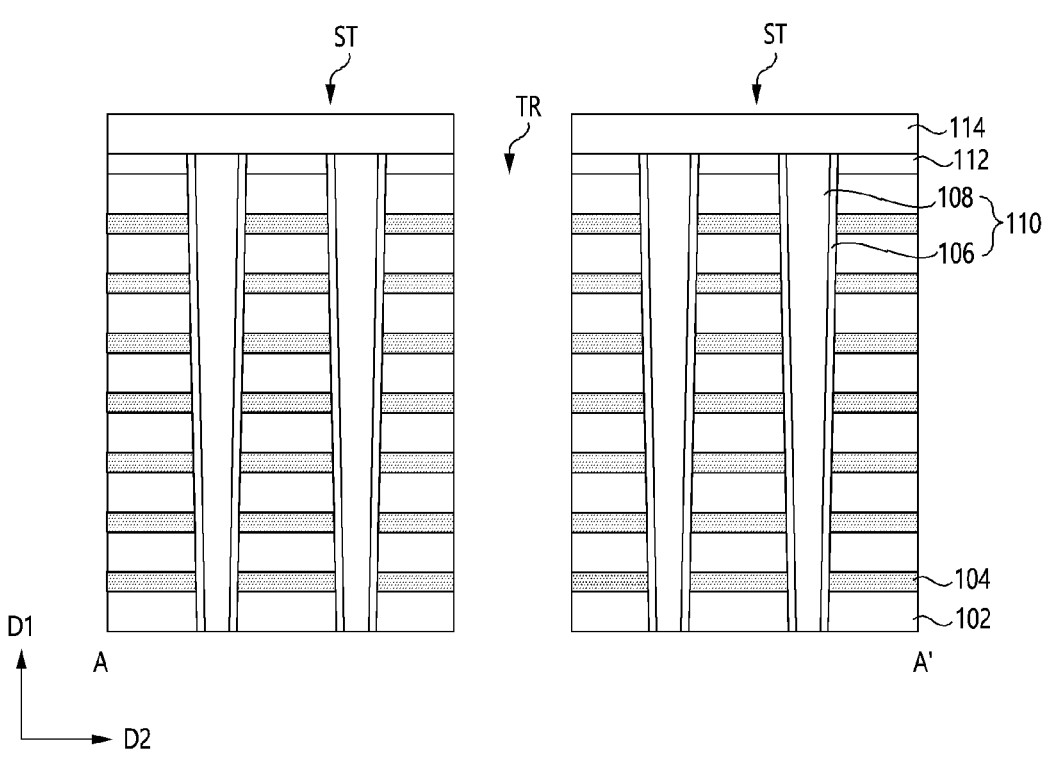

Referring to FIG. 5, the insulating interlayer 112 may be etched using the mask pattern 114. The stack structure ST may be etched using the mask pattern 114 and the etched insulating interlayer 112 as an etch mask to form a trench TR.

The trench TR may be extended along a first direction D1. For example, the trench TR may divide the stack structure ST into two stack structures ST. For example, the divided stack structures ST may correspond to a unit memory block of the 3D semiconductor device.

The trench TR may be formed in the cell region CA. The contact area CTA may be masked during the trench TR may be formed. After forming the trench TR, the mask pattern may then be removed.

Figure 6A:
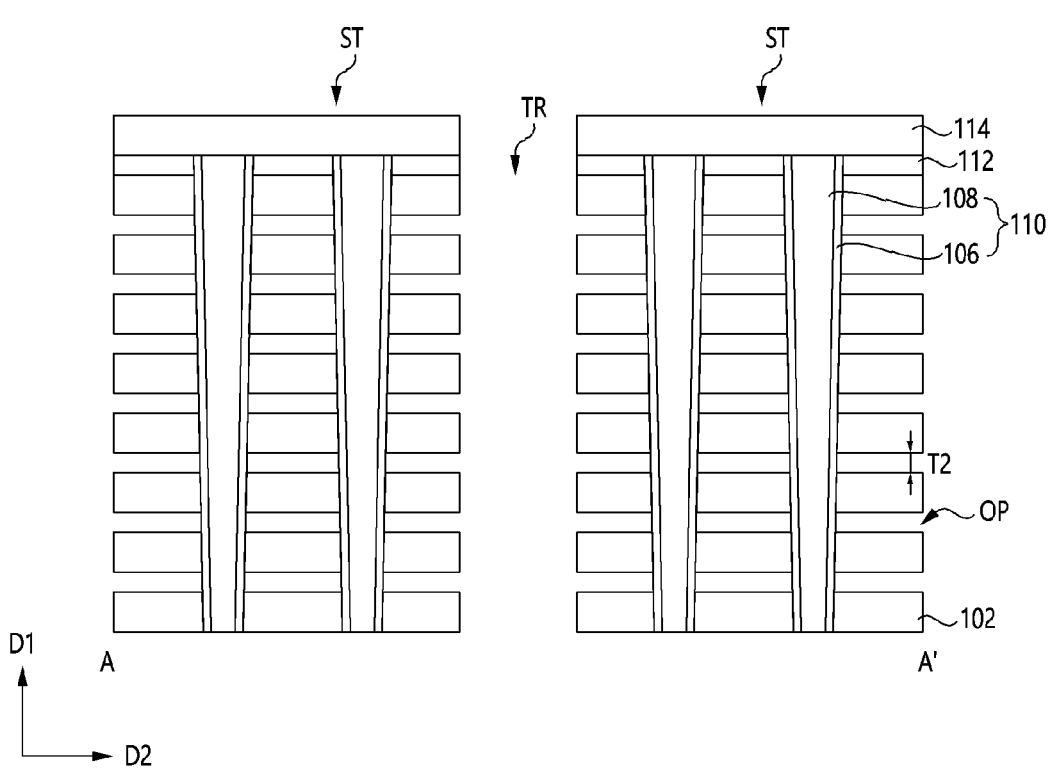
Figure 6B:
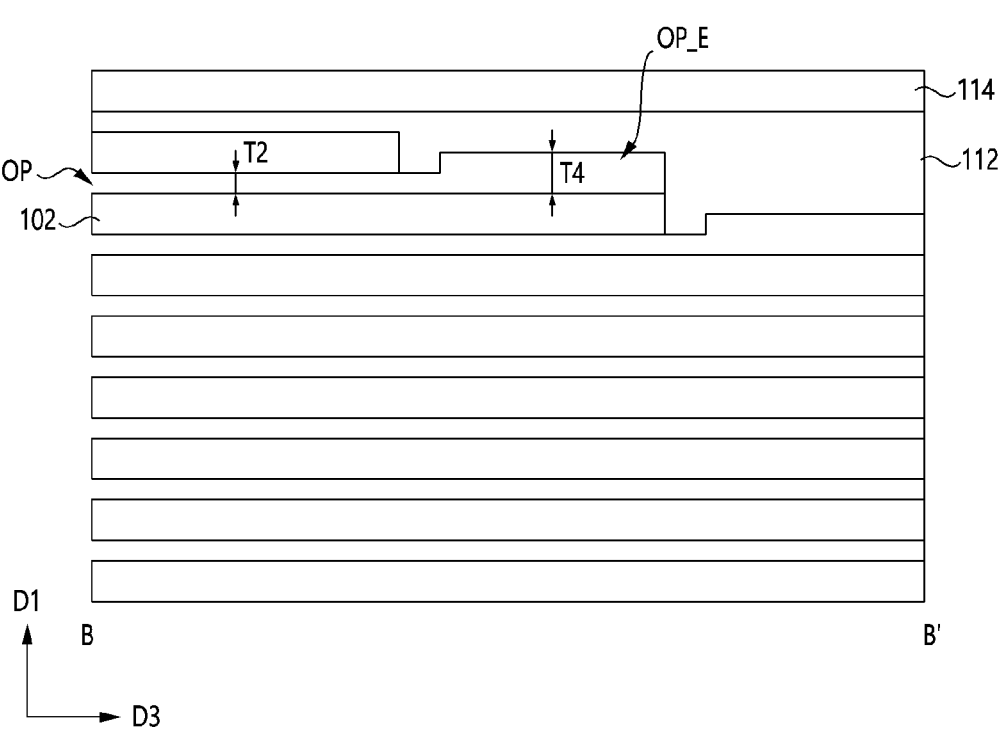

Referring to FIGS. 6A and 6B, the exposed sacrificial patterns 104 may be removed to form openings OP between the adjacent first insulation patterns 102. As mentioned above, the sacrificial patterns 104 may include the material having an etching selectivity with respect to the etchant for the first insulation patterns 102. Thus, the sacrificial patterns 104 may be selectively removed.

In this embodiment, each of the openings OP may have a first gap in the cell region CA and a second gap in the contact area CTA. The second gap may be larger than the first gap. Further, the second gap may be corresponded to an end opening OP_E. For example, the first gap may include the second thickness T2 and the second gap, that is, the end opening OP_E may include the fourth thickness T4.

Figure 7A:
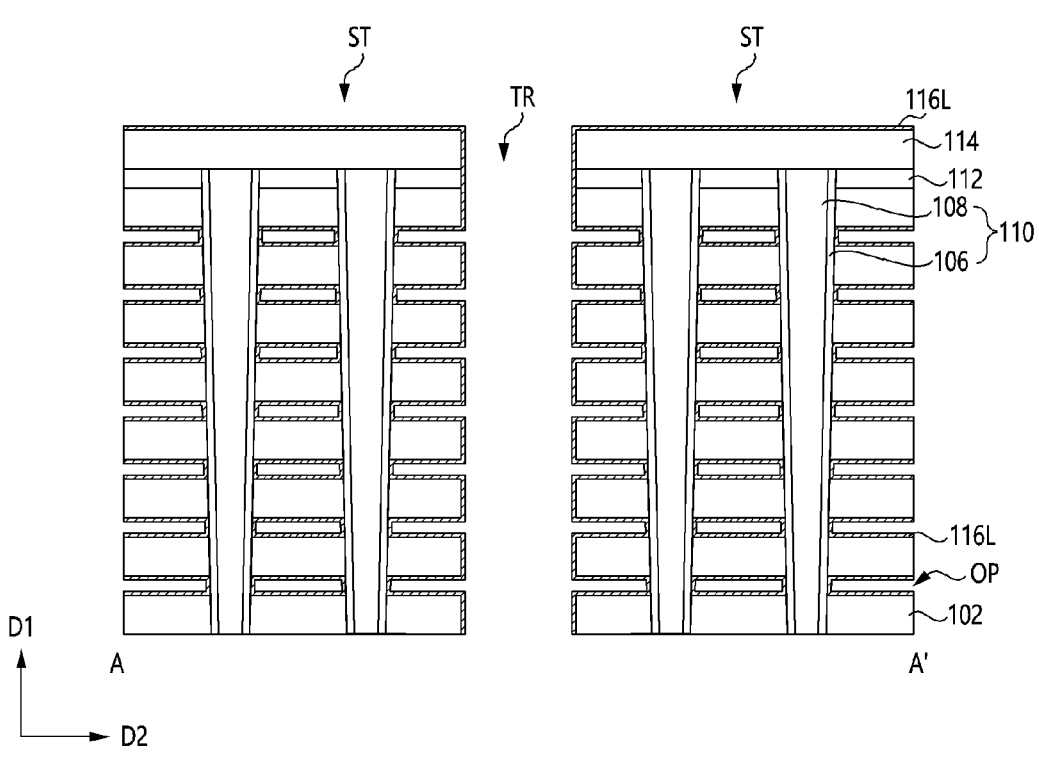
Figure 7B:
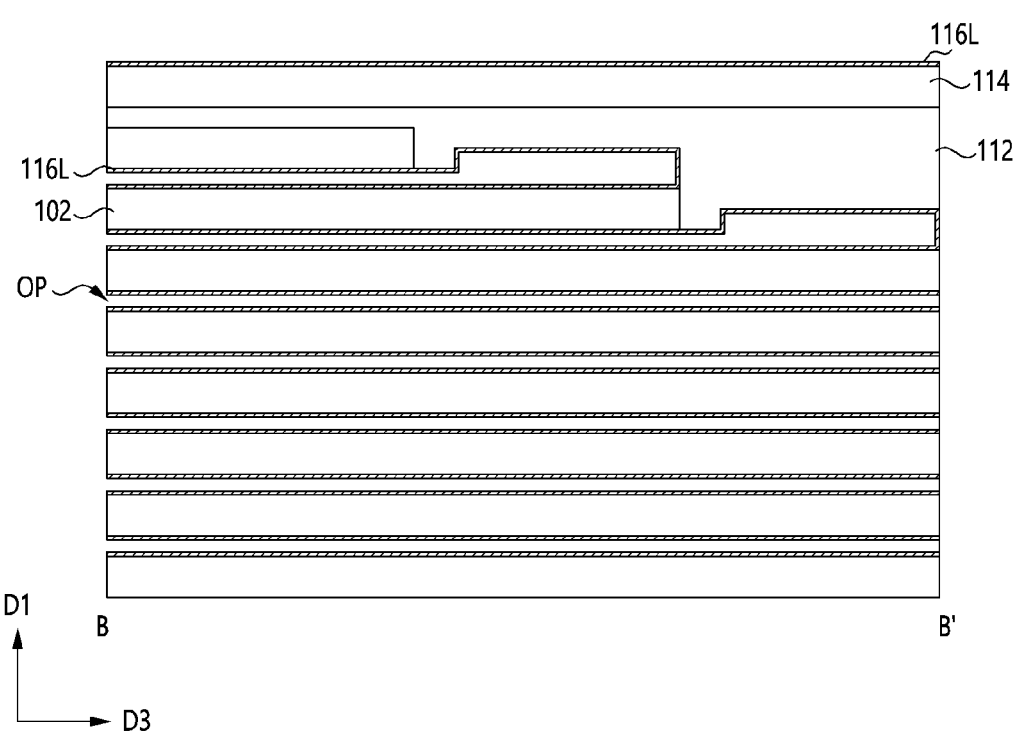

Referring to FIGS. 7A and 7B, a conductive layer 116L may be conformally formed on an exposed surface of the openings OP in the stack structure ST, The conductive layer 116L may be formed in the cell region CA and the contact area CTA.

The conductive layer 116L may include a metal such as tungsten, molybdenum, etc., or polysilicon including conductive impurities. When the conductive layer 116L may include the tungsten, the tungsten may have a minimum thickness. For example, the conductive layer 116L may have a thickness determined by the second thickness TH and a resistance of a word line. However, the openings OP might not be fully filled with the conductive layer 116L. Alternatively, the conductive layer 116L may include a barrier layer and a conductive material layer stacked on the barrier layer.

In this case, the barrier layer may include a TiN layer or Ti/TiN layers and the conductive material layer may include a tungsten layer.

Figure 8A:
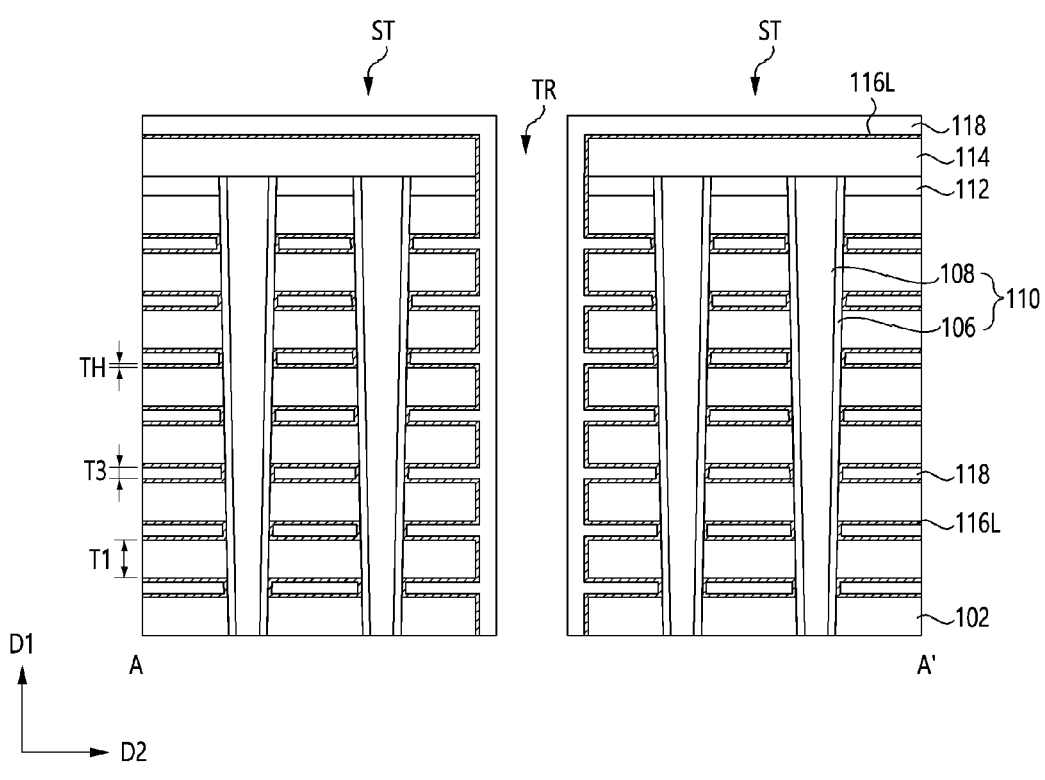
Figure 8B:
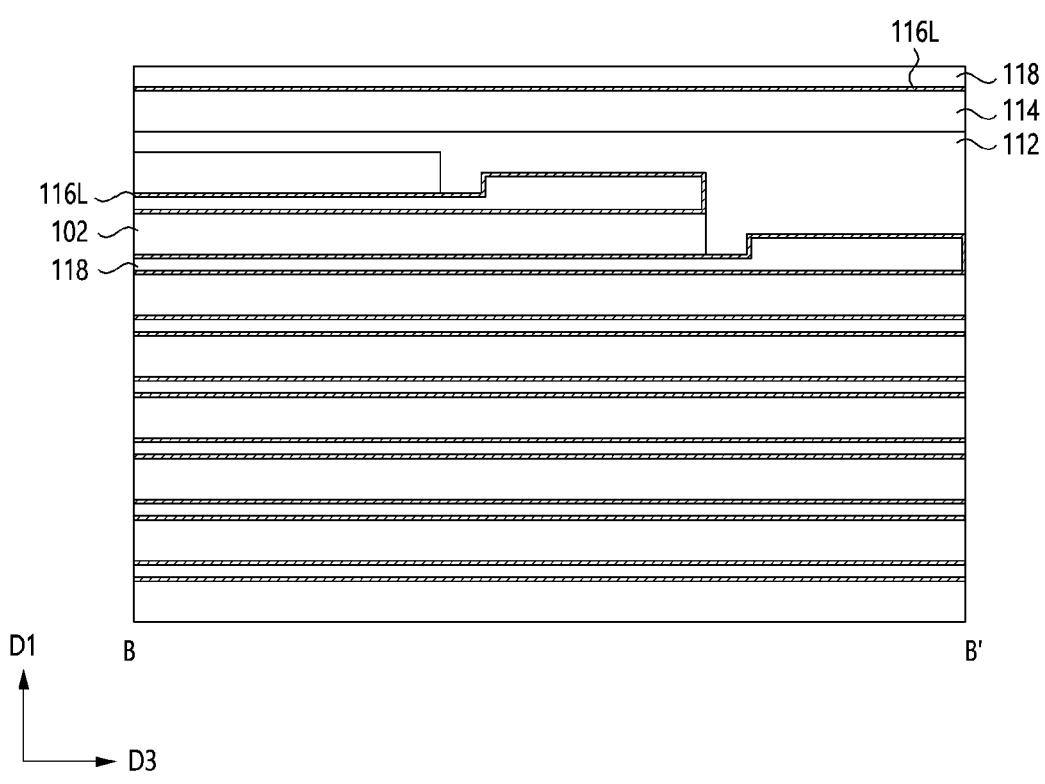

Referring to FIGS. 8A and 8B, the openings OP with the conductive layer 116L may be filled with second insulation patterns 118. The second insulation patterns 118 may be formed in the cell region CA and the contact area CTA, An end portion 118E of each of the second insulation patterns 118 in the contact area CTA may have a thickness thicker than that of the second insulation patterns in the cell region CA.

The second insulation patterns 118 may include at least one of a silicon oxide layer, a silicon nitride layer and a silicon oxy-nitride layer. In various embodiments, the second insulation patterns 118 may be used as the silicon oxide layer. Further, the first insulation patterns 102 and the second insulation patterns 118 may include the same material. Alternatively, the first insulation patterns 102 and the second insulation patterns 118 may include different materials.

As mentioned above, the first gap of the opening OP may be substantially the same as the second thickness T2. The conductive layer may be formed on the stack structures ST defined by the opening OP. Thus, the second insulation patterns 118 in the openings OP may have the third thickness T3 thinner than the second thickness T2. The thickness T1 of the first insulation pattern 102 may be thicker than the thickness T3 of the second insulation pattern 118.

Figure 9:
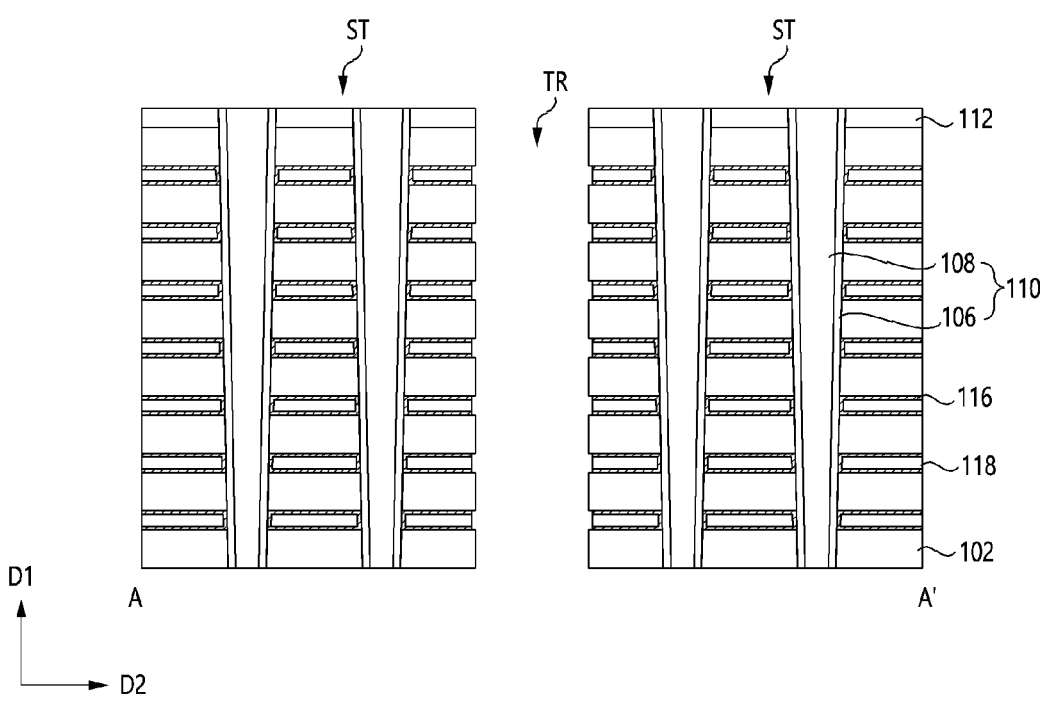

Referring to FIG. 9, the conductive layer exposed through the trench TR may be etched to form preliminary conductive patterns 116. The etching of the conductive layer exposed through the trench TR may electrically isolate the stack structures ST from each other.

Any one of the preliminary conductive patterns 116 may be configured to surround the sidewall of the second insulation pattern 118. That is, in a cross-sectional view, the preliminary conductive patterns 116 may be configured to surround the lower surface, the upper surface and the side surface of the second insulation pattern 118.

Figure 10:
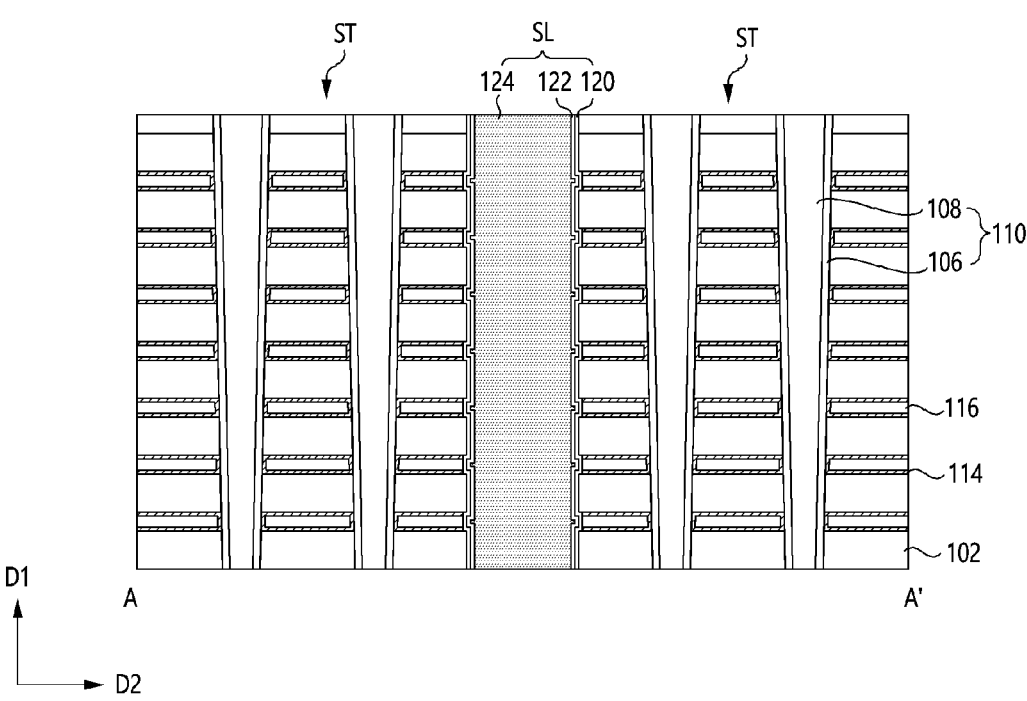

Referring to FIG. 10, a slit structure SL may be formed in the trench TR. In various embodiments, insulation spacers 120 and 122 may be conformally formed on an inner surface of the trench TR. The trench TR with the insulation spacers 120 and 122 may be filled with a conductive material to form a source contact plug 124, Alternatively, the trench TR may be filled with an insulation material to form the insulation spacers 120 and 122.

Figure 11:
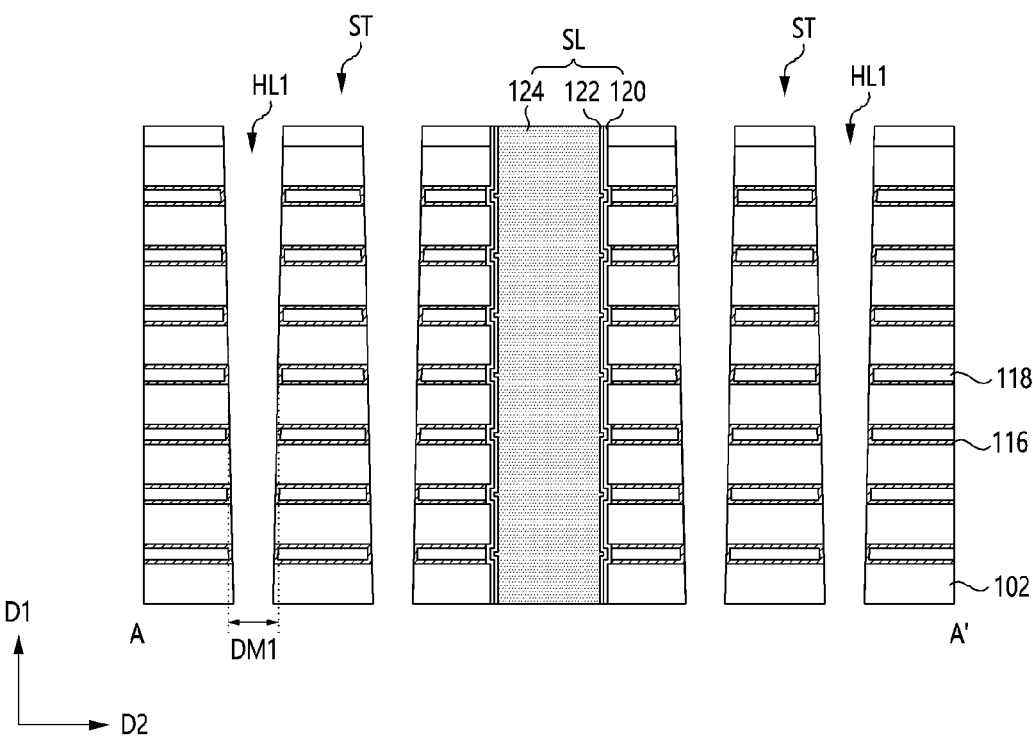

Referring to FIG. 11, the sacrificial pillars 110 in the cell region CA may be removed to define the first holes HL1 of each of the stack structures ST. As mentioned above, each of the first holes HL1 may have the first diameter DM1. Each of the preliminary conductive patterns 116 exposed through the first holes HL1 may be configured to surround the lower surface, the upper surface and the side surface of the second insulation pattern 118.

Figure 12A:
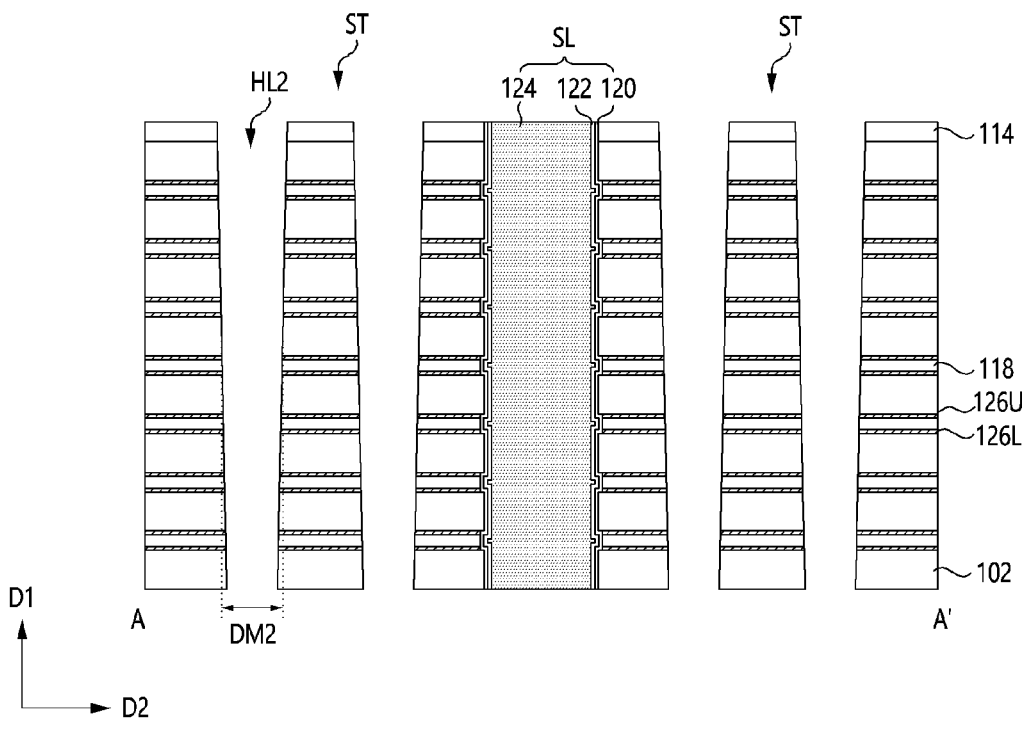
Figure 12B:
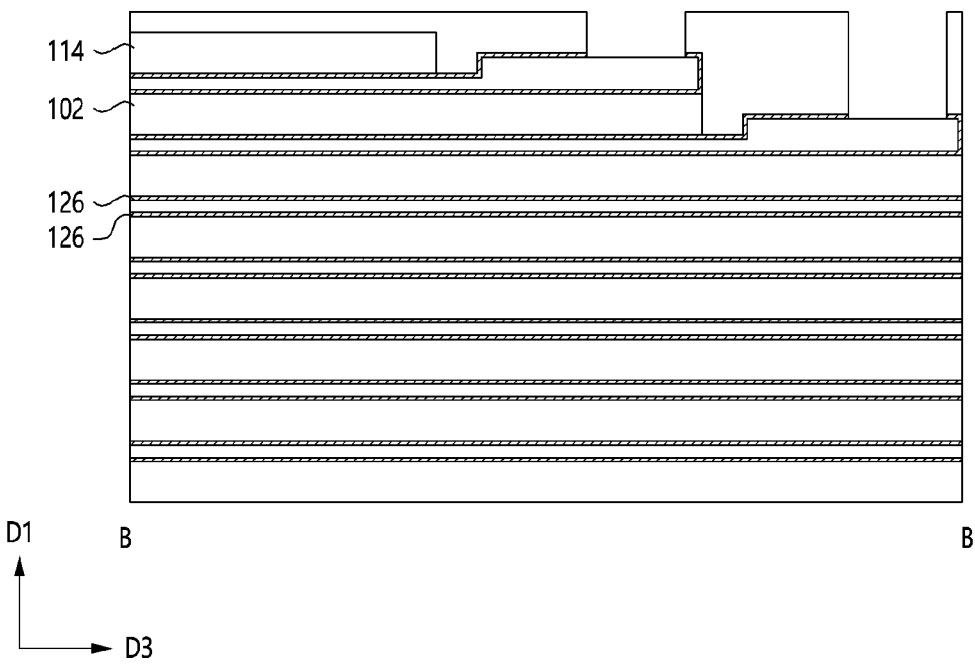

Referring to FIGS. 12A and 12B, side surfaces of the preliminary conductive patterns 116 exposed through the first holes HL1 may be etched to form second holes HL2, Each of the second holes HL2 may have a second diameter DM2 longer than the first diameter DM1.

By forming the second holes HL2, one preliminary conductive pattern 116 may be divided into an upper conductive pattern 126U and a lower conductive pattern 126L.

During the side surfaces of the preliminary conductive patterns exposed through the first holes HL1 in the cell region CA may be etched, the preliminary conductive patterns 116 formed at the end portion 118E of the second insulation pattern 118 may be partially etched to divide the preliminary conductive patterns 116 into the two conductive patterns 126.

Thus, the preliminary conductive patterns 116 may be divided into the upper and lower conductive patterns 126 to form the 3D semiconductor device having a high integration degree in a same area.

Referring again to FIG. 1B, the vertical channel structures CH may be formed in the second holes HL2 in the cell region CA.

Particularly, the memory layers 128, 130 and 132 may be conformally formed on inner surfaces of the second holes HL2. The memory layers 128, 130 and 132 may be formed by sequentially stacking the blocking insulation layer 128, the data storage layer 130 and the tunnel insulation layer 132. The channel 134 may be formed in the second holes HL2 with the memory layers 128, 130 and 132.

Referring to FIG. 1C, a plurality of the contact plugs CT may be electrically connected with the conductive patterns 126 in the contact area CTA.

Figure 13:
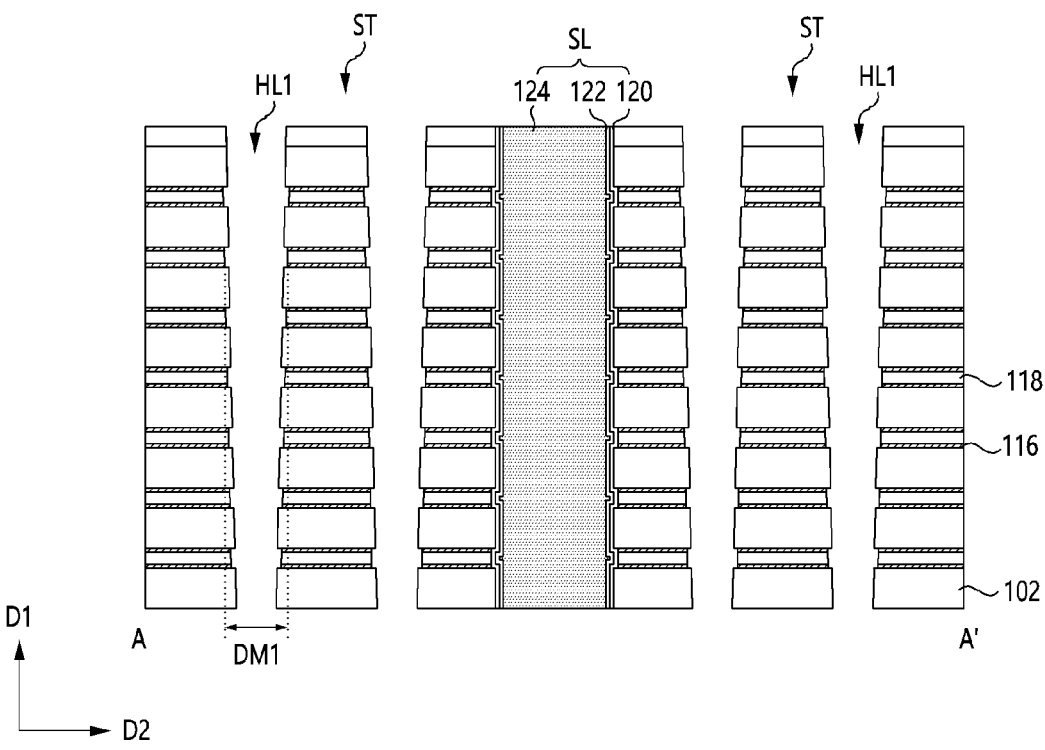
FIG. 13 is a cross-sectional view illustrating a method of manufacturing a 3D semiconductor device in accordance with various embodiments.

FIG. 13 is a cross-sectional view illustrating a method of manufacturing a 3D semiconductor device in accordance with various embodiments.

The structure in FIG. 11 may be formed by the processes illustrated with reference to FIGS. 4A, 4B, 5, 6A, 6B, 7A, 7B, 8A, 8B, 9, 10 and 11.

Referring to FIG. 13, the side surfaces of the preliminary conductive patterns 116 exposed through the first holes HL1 may be wet-etched. That is, portions of the preliminary conductive patterns 116 covered by the first insulation patterns 102 and the second insulation patterns 118 might not be etched. In contrast, the side surfaces of the preliminary conductive patterns 116 exposed through the first holes HL1 may be selectively etched. Thus, by selectively etching the side surfaces of the preliminary conductive patterns 116, one preliminary conductive pattern 116 may be electrically divided into an upper conductive pattern and a lower conductive pattern. As a result, each of the preliminary conductive patterns 116 may be divided into the upper and lower conductive patterns 126 to form the 3D semiconductor device having a high integration degree in a same area.

In various embodiments, a size of the first hole HL1 may be partially expanded. However, the size of the first hole HL1 may be maintained.

Referring again to FIG. 3, the vertical channel structures CH may be formed in the first holes HL1. The vertical channel structure CH may have a shape corresponding to a shape of the first hole HL1.

Figure 14:
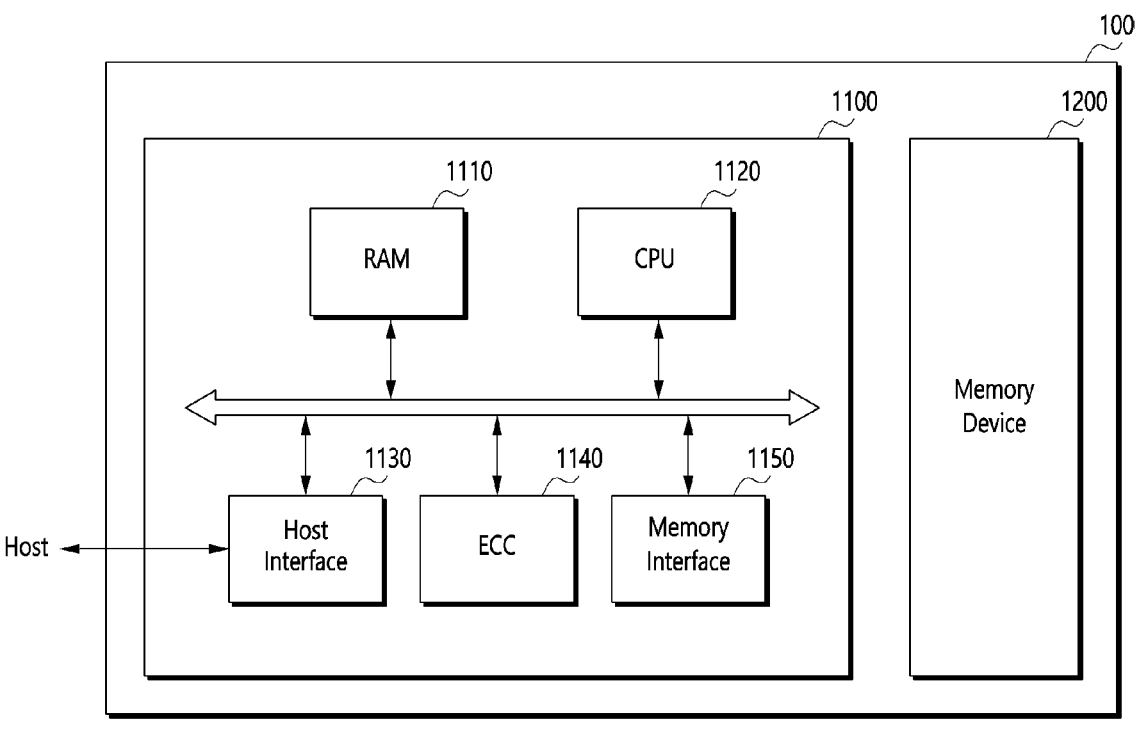
FIG. 14 is a block diagram illustrating a memory system in accordance with various embodiments.

FIG. 14 is a block diagram illustrating a memory system in accordance with various embodiments.

As illustrated in FIG. 14, a memory system 1000 may include a memory device 1200 and a controller 1100.

The memory device 1200 may be used to store various data types such as text, graphic and software code. The memory device 1200 may be a non-volatile memory. In an embodiment, the memory device 1200 may improve an integration density of stacked word lines by the preliminary conductive pattern surrounding the insulation pattern, as shown in FIG. 1 to FIG. 13.

The controller 1100 may be couple to a host and the memory device 1200, and the controller 1100 may access the memory device 1200 in response to a request from the host. For example, the controller 1100 may control read, write, erase and background operations of the memory device 1200.

The controller 1100 may include a random access memory (RAM) 1110, a central processing unit (CPU) 1120, a host interface 1130, an error correction code (ECC) circuit 1140 and a memory interface 1150.

The RAM 1110 may function as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The host interface 1130 may be interface with the host. For example, the controller 1100 may communicate with the host through one of various interface protocols with a Universal Serial Bus (USB) protocol, a multimedia card (MMC) protocol, a peripheral component interconnection (PCI) protocol, a PCI express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol and a private protocol.

The ECC circuit 1140 may detect and correct errors included in data read from the memory device 1200 by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) configured to temporarily store data. The buffer memory may temporarily store data, externally transferred through the host interface 1130, or temporarily store data, transferred from the memory device 1200 through the memory interface 1150. In addition, the controller 1100 may further include ROM storing code data to interface with the host.

Figure 15:
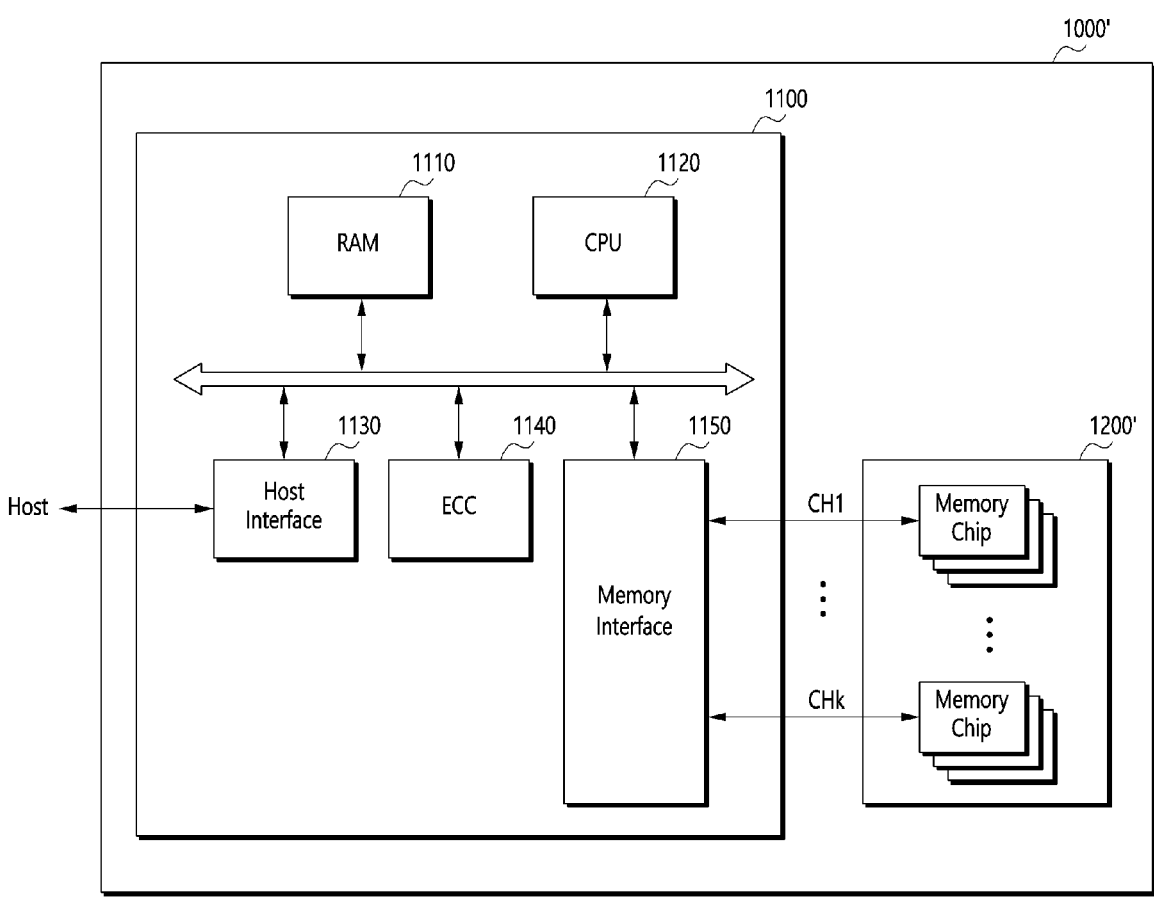
FIG. 15 is a block diagram illustrating a memory system in accordance with various embodiments.

FIG. 15 is a block diagram illustrating a memory system in accordance with various embodiments.

As illustrated in FIG. 15, a memory system 1000' may include a memory device 1200' and the controller 1100. In addition, the controller 1100 may include the RAM 1110, the CPU 1120, the host interface 1130, the ECC circuit 1140 and the memory interface 1150.

The memory device 1200', in an embodiment, may improve an integration density of stacked word lines by the preliminary conductive pattern surrounding the insulation pattern, as shown in FIG. 1 to FIG. 13.

In addition, the memory device 1200' may be a multi-chip package composed of a plurality of memory chips. The plurality of memory chips may have the stack structures ST of FIG. 1 to FIG. 13.

As described above, in an embodiment, a property of the memory system 1000 can be improved, because the memory system includes the memory device 1200 including at least one stack structure improved the integrated density of the word lines, as shown in FIG. 1 to FIG. 13.

Figure 16:
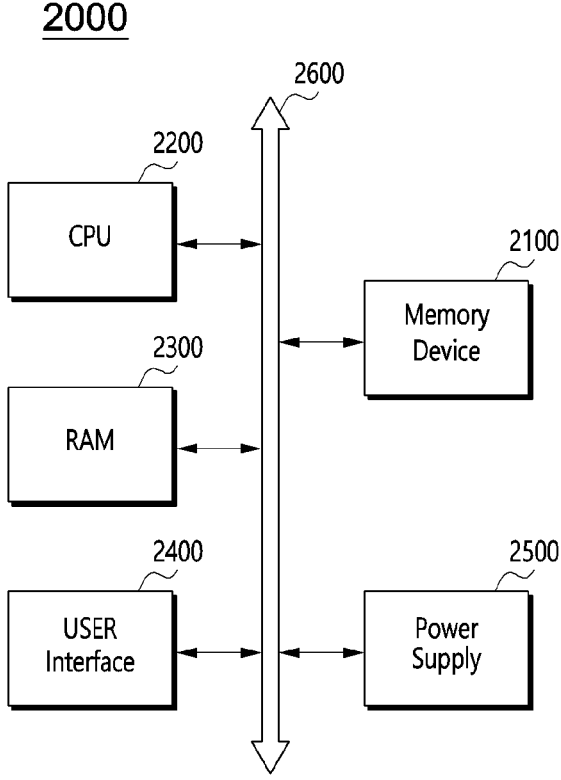
FIG. 16 is a block diagram illustrating a computing system in accordance with various embodiments.

FIG. 16 is a block diagram illustrating a computing system in accordance with various embodiments.

As illustrated in FIG. 16, a computing system 2000 may include a memory device 2100, a CPU 2200, a random-access memory (RAM) 2300, a user interface 2400, a power supply 2500 and a system bus 2600.

The memory device 2100 may store data, which is input through the user interface 2400, and data, which is processed by the CPU 2200. In addition, the memory device 2100 may be electrically coupled to the CPU 2200, the RAM 2300, the user interface 2400 and the power supply 2500. For example, the memory device 2100 may be coupled to the system bus 2600 through a controller (not illustrated) or directly coupled to the system bus 2600. When the memory device 2100 is directly coupled to the system bus 2600, functions of the controller may be performed by the CPU 2200 and the RAM 2300.

The memory device 2100, in an embodiment, may improve an integration density of stacked word lines by the preliminary conductive pattern surrounding the insulation pattern, as shown in FIG. 1 to FIG. 13.

The computing system 2000 having the above-described configuration may be one of various components of an electronic device, such as a computer, an ultra-mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for computing systems, etc.

As described above, in an embodiment, a property of the computing system 2000 can be improved by improving the integrated density of the word lines of the memory device 1200, as shown in FIG. 1 to FIG. 13.

Figure 17:
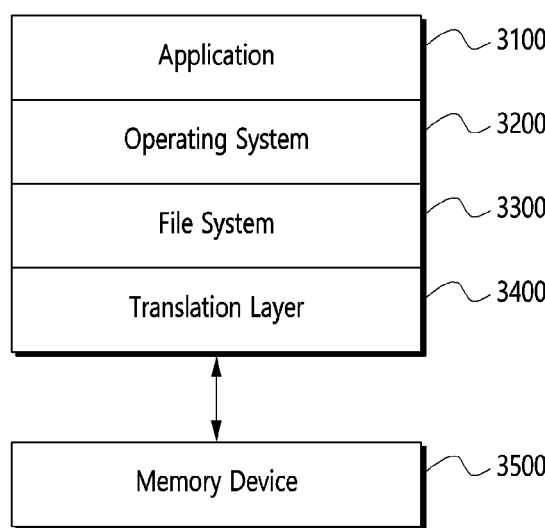
FIG. 17 is a block diagram illustrating a computing system in accordance with examples of embodiments.

FIG. 17 is a block diagram illustrating a computing system in accordance with examples of embodiments.

As illustrated in FIG. 17, a computing system 3000 may include a software layer that has an operating system 3200 an application 3100, a file system 3300 and a translation layer 3400. In addition, the computing system 3000 may include a hardware layer such as a memory system 3500.

The operating system 3200 manages software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data to be stored in the memory device 3500 according to rules. The file system 3300 may be determined depending on the operating system 3200 that is used in the computing system 3000. For example, when the operating system 3200 is a Microsoft Windows-based system, the file system 3300 may be a file allocation table (FAT) or an NT file system (NTFS). In addition, when the operating system 3200 is a Unix/Linux-based system, the file system 3300 may be an extended file system (EXT), a Unix file system (UFS) or a journaling file system (JFS).

The translation layer 3400 may translate an address to be suitable for the memory device 3500 in response to a request from the file system 3300. For example, the translation layer 3400 may translate a logic address, generated by the file system 3300, into a physical address of the memory device 3500, Mapping information of the logic address and the physical address may be stored in an address translation table. For example, the translation layer 3400 may be a flash translation layer (FTL), a universal flash storage link layer (ULL) or the like.

The memory device 3500, in an embodiment, may improve an integration density of stacked word lines by the preliminary conductive pattern surrounding the insulation pattern, as shown in FIG. 1 to FIG. 13.

The computing system 3000 with the above-described configuration may be divided into an operating system layer that is operated in an upper layer region and a controller layer that is operated in a lower level region. The operating system 3200, the application 3100, and the file system 3300 may be included in the operating system layer and driven by an operation memory. In addition, the translation layer 3400 may be included in the operating system layer or the controller layer.

As described above, in an embodiment, a property of the computing system 3000 can be improved using the stack structure in which the integrated density of the word lines of the memory device 1200 is improved, as shown in FIG. 1 to FIG. 13.

The above described embodiments are intended to illustrate and not to limit the embodiments. Various alternatives and equivalents are possible. The embodiments are not limited by the embodiments described herein, Nor are the embodiments limited to any specific type of semiconductor device. Another additions, subtractions, or modifications are obvious in view of the present disclosure and are intended to fall within the scope of the appended claims.

What is claimed is:

1. A three-dimensional (3D) semiconductor device comprising:
   a stack structure including a first insulation pattern, a lower conductive pattern and a second insulation pattern sequentially stacked, the first insulation pattern having a first thickness, and the second insulation pattern having a second thickness different from the first thickness; and
   at least one vertical channel structure arranged in the stack structure,
   wherein an upper surface of the lower conductive pattern is directly in contact with a lower surface of the second insulation pattern,
   wherein an upper conductive pattern arranged on an upper surface of the second insulation pattern and the lower conductive pattern arranged on a lower surface of the second insulation pattern are electrically isolated by a cut portion at an upper surface of the second insulation pattern, and
   wherein the lower conductive pattern is extended to the lower surface of the second insulation pattern, a side surface of the second insulation pattern and an edge of an upper surface of the second insulation pattern.

2. The 3D semiconductor device of claim 1, wherein the stack structure further comprises an upper conductive pattern in direct contact with the upper surface of the second insulation pattern.

3. The 3D semiconductor device of claim 2, wherein the upper conductive pattern comprises a material and a thickness substantially the same as a material and a thickness of the lower conductive pattern.

4. The 3D semiconductor device of claim 1, wherein the cut portion is located between the upper conductive pattern and the lower conductive pattern, which is positioned at the edge of the upper surface of the second insulation pattern.

5. The 3D semiconductor device of claim 1, wherein the first thickness is thicker than the second thickness.

6. The 3D semiconductor device of claim 5,
   wherein the lower conductive pattern has a third thickness thinner than the first thickness,
   wherein the third thickness is thinner than the second thickness, and wherein the first thickness is greater than a sum of the second thickness and two times the third thickness.

7. The 3D semiconductor device of claim 1, wherein the lower conductive pattern comprises molybdenum.

8. The 3D semiconductor device of claim 1, wherein the lower conductive pattern comprises a barrier layer and a conductive layer which are stacked, the barrier layer is in contact with at least one surface of the first insulation pattern and the conductive layer is in contact with at least one surface of the second insulation pattern.

9. The 3D semiconductor device of claim 1, wherein the first insulation pattern and the second insulation pattern comprise a selected one of a same material and different materials.

10. The 3D semiconductor device of claim 9, wherein at least one of the first and second insulation patterns comprises at least one of an oxide, a nitride, an insulation material including impurities and an air gap, and wherein the oxide includes a silicon oxide, and an oxide containing a metal, and the nitride includes a silicon nitride and a silicon oxynitride.

11. A 3D semiconductor device comprising:

a stack structure including at least one unit memory block, the at least one unit memory block including a first insulation pattern, a lower word line, a second insulation pattern and an upper word line at least once sequentially stacked in a cell region and a contact area; and at least one vertical channel structure including a data storage layer formed through the stack structure in the cell region, wherein the first insulation pattern in the cell region has a thickness thicker than a thickness of the second insulation pattern in the cell region, wherein the upper word line arranged on an upper surface of the second insulation pattern and the lower word line arranged on a lower surface of the second insulation pattern are electrically isolated by a cut portion at an upper surface of the second insulation pattern, and wherein the lower word line is extended to a lower surface of the second insulation pattern, a side surface of the second insulation pattern and an edge of an upper surface of the second insulation pattern.

12. The 3D semiconductor device of claim 11, wherein each of the upper word line and a lower word line has a thickness thinner than a thickness of the second insulation pattern.

13. The 3D semiconductor device of claim 12, wherein the first insulation pattern has a thickness thicker than a sum of the thickness of the lower word line, the thickness of the second insulation pattern and the thickness of the upper word line.

14. The 3D semiconductor device of claim 11, wherein at least one of the upper word line and the lower word line comprises molybdenum.

15. The 3D semiconductor device of claim 11, wherein each of the upper word line and the lower word line comprises a barrier layer and a conductive layer, the barrier layer is in contact with an upper surface of the first insulation pattern and the conductive layer is in contact with the upper surface of the second insulation pattern.

16. The 3D semiconductor device of claim 11, wherein the first and second insulation patterns comprise one of a same material and different materials.

17. The 3D semiconductor device of claim 11, wherein the second insulation pattern in the contact area has a thickness thicker than a thickness of the second insulation pattern in the cell region.

18. The 3D semiconductor device of claim 11, further comprising:

a first contact arranged in the contact area and in contact with the upper word line; and a second contact arranged in the contact area and in contact with the lower word line arranged on the edge of the upper surface of the second insulation pattern, wherein the first contact and the second contact have a same height.

19. The 3D semiconductor device of claim 11, wherein the vertical channel structure further comprises at least one protruded portion arranged at an outer surface of the vertical channel structure corresponding to the second insulation pattern.

* * * * *